US006432554B1

(12) United States Patent
Barber et al.

(10) Patent No.: US 6,432,554 B1
(45) Date of Patent: *Aug. 13, 2002

(54) APPARATUS AND METHOD FOR MAKING AN ELECTRICAL COMPONENT

(75) Inventors: John P. Barber, Kettering; David P. Bauer, Xenia; Duane C. Newman, London; Edward A. Knoth, Beavercreek, all of OH (US)

(73) Assignee: IAP Research, Inc., Dayton, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/504,678

(22) Filed: Feb. 15, 2000

Related U.S. Application Data

(60) Continuation-in-part of application No. 08/681,898, filed on Jul. 29, 1996, now Pat. No. 6,273,963, which is a continuation-in-part of application No. 08/368,301, filed on Jan. 3, 1995, now Pat. No. 5,611,230, which is a division of application No. 07/834,148, filed on Feb. 10, 1992, now Pat. No. 5,405,574.
(60) Provisional application No. 60/120,244, filed on Feb. 16, 1999.

(51) Int. Cl.[7] ................................ B22F 3/02; B22F 7/04
(52) U.S. Cl. .................... 428/553; 148/108; 419/66; 425/78
(58) Field of Search ................... 148/108; 419/66; 428/553; 425/78

(56) References Cited

U.S. PATENT DOCUMENTS

| 2,966,704 A | 1/1961 | O'Brian et al. |
| 2,976,907 A | 3/1961 | Harvey et al. |
| 3,346,914 A | 10/1967 | Sandstrom et al. |
| 3,347,074 A | 10/1967 | Eilers et al. |

(List continued on next page.)

FOREIGN PATENT DOCUMENTS

| DE | 975 730 C | 7/1962 |
| WO | WO 98 06525 A | 2/1998 |

OTHER PUBLICATIONS

U.S. Statutory Invention Registration No. H120, issued to Corwin, published on Sep. 2, 1986, for Method of Electroforming a Ceramic Faced Workpiece.
"Melt–Textured Growth of Polycrystaline", Physical Review B, vol. 37, No. 13, May 1, 1988.
"High–Field Critical Current Densities", 1989 Applied Physics Letters, p. 2441.
"Hot Extrusion of High–Temperature Superconducting Oxides", American Ceramics Bulletin, p. 813, May 1991.
"Crystallographically Oriented Superconducting bi2Sr2CaCu2O8 by Shock Compaction of Prealigned Powder", Applied Physics Letters 57, p. 93, Jul. 2, 1990.
"Metal Matrix High–Temperature Superconductor", Metal Progress, Advanced Materials and Processes, Inc., p. 37, Oct. 1987.
"Densification of Yba2CuO7 8 by Uniaxial Pressure Sintering", Cryogenics, vol. May 30, 1990.

(List continued on next page.)

Primary Examiner—Daniel J. Jenkins
(74) Attorney, Agent, or Firm—Jacox, Meckstroth & Jenkins

(57) ABSTRACT

This invention relates to a transformer and more particularly, to a system and method for making a transformer utilizing dynamic magnetic compaction. A coil is placed in a conductive container, and a conductive powder material, such as ferrite, is placed in the container and surrounds the coil and the turns of the coil. A power supply energizes a capacitor which subsequently provides a high energizing current to a second, energizing coil within which the container, material and inner coil are situated, thereby causing the container, powder materials and coil to be compacted to provide an electrical component, such as a transformer, motor, commutator, rotor or choke.

45 Claims, 3 Drawing Sheets

U.S. PATENT DOCUMENTS

| | | |
|---|---|---|
| 3,838,488 A | 10/1974 | Tada et al. |
| 4,130,926 A | 12/1978 | Willem |
| 4,170,887 A | 10/1979 | Baranow |
| 4,261,092 A | 4/1981 | Corwin |
| 4,297,388 A | 10/1981 | Kumar et al. |
| 4,380,473 A | 4/1983 | Lichtinghagen |
| 4,592,889 A | 6/1986 | Leupold et al. |
| 4,696,100 A | 9/1987 | Hiromasa et al. |
| 4,717,627 A | 1/1988 | Nellis et al. |
| 4,762,754 A | 8/1988 | Nellis et al. |
| 4,929,415 A | 5/1990 | Okazaki |
| 4,939,121 A | 7/1990 | Rybka |
| 4,962,656 A | 10/1990 | Kunerth et al. |
| 5,030,614 A | 7/1991 | Hollinder et al. |
| 5,057,486 A | 10/1991 | Arendt et al. |
| 5,079,255 A | 1/1992 | Holloway |
| 5,084,088 A | 1/1992 | Okazaki |
| 5,096,880 A | 3/1992 | Rybka |
| 5,101,560 A | 9/1992 | Leonard et al. |
| 5,162,296 A | 11/1992 | Yamazaki |
| 5,169,572 A | 12/1992 | Matthews |
| 5,214,840 A | 6/1993 | Imagawa et al. |
| 5,250,255 A | 10/1993 | Sagawa et al. |
| 5,262,396 A | 11/1993 | Yamazuki |
| 5,004,722 A | 4/1994 | Tallman |
| 5,405,574 A * | 4/1995 | Chelluri et al. ............... 419/47 |
| 5,503,686 A | 4/1996 | Okamura et al. |
| 5,611,139 A | 3/1997 | Chelluri et al. |
| 5,611,230 A * | 3/1997 | Chelluri et al. ............... 72/56 |
| 5,689,797 A | 11/1997 | Chelluri et al. |
| 6,273,963 B1 * | 8/2001 | Barber ....................... 148/108 |

OTHER PUBLICATIONS

"Electromagnetic Forming", Pulsed Power Lecture Series, Lecture No. 36 by J. Bennett and M. Plum.

German publication entitled, Planseeberichte Fur Pulvermetallurgie, Pulverdichten mit Magnetimpulsen, pp. 175–190, 1976.

"Dynamic Magnetic Compaction (DMC) of W–Steel Composite Powders", Specialty Materials and Composites Advances in Particulate Materials, Metal Powder Industries Federation: Princeton, N.J. vol. 5, pp. 219–226, 1994.

"Composite Solid Armature Consolidation by Pulse Power Processing: A Novel Homopolar Generator Application in EML Technology", Transactions on Magnetics, vol. 25, No. 1, pp. 429–432, Jan. 1989.

"High–Energy, High–Rate Materials Processing", Journal of Metals, pp. 6–10, Dec. 1987.

"Explosive Compaction of Metal Powders", C.R.A. Lennon, A. K. Bhalla and J. D. Williams, Powder Metallurgy, 1978, No. 1.

* cited by examiner

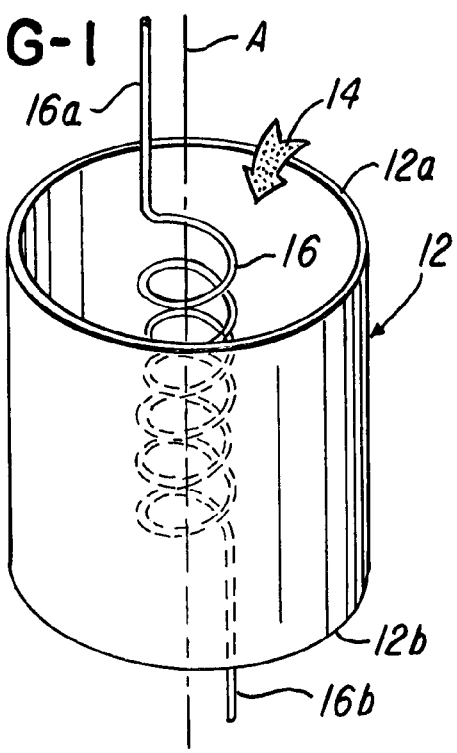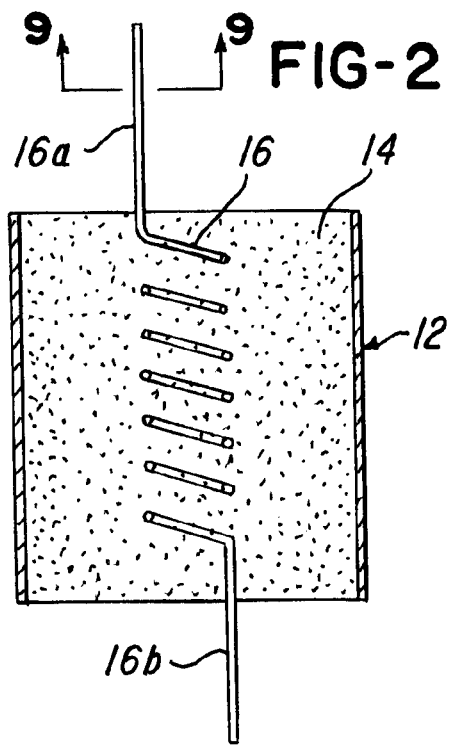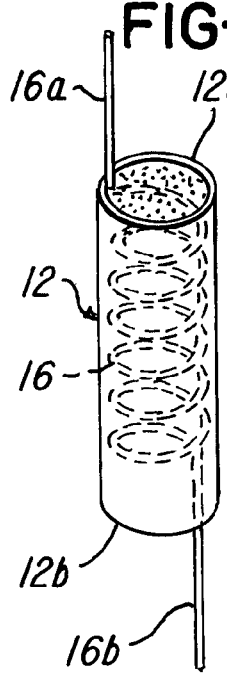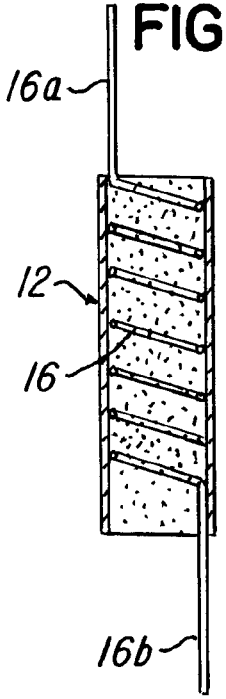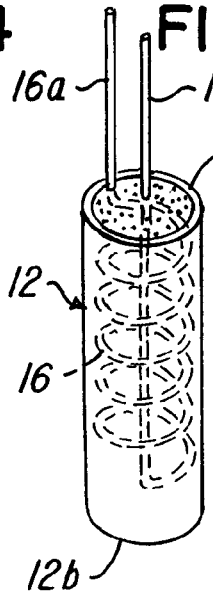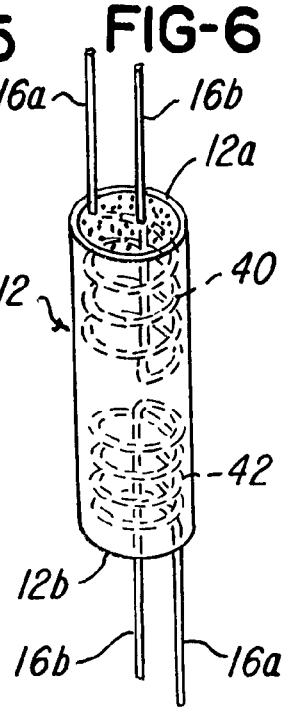

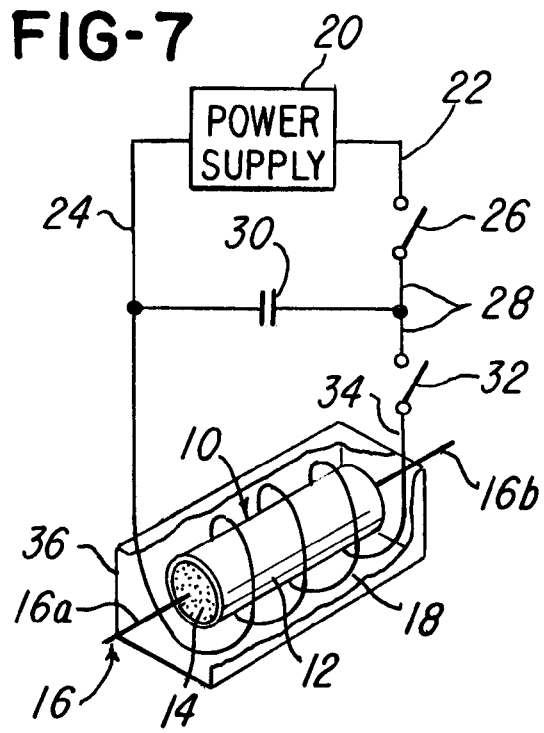
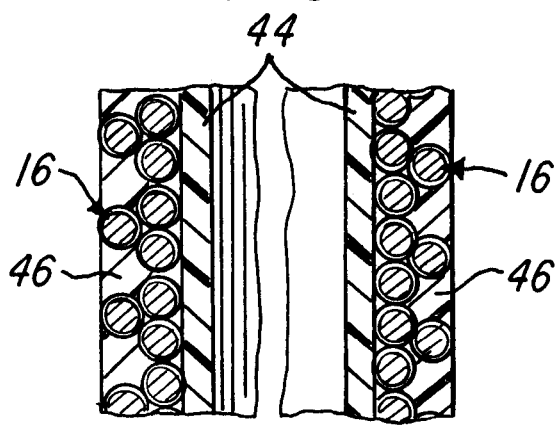
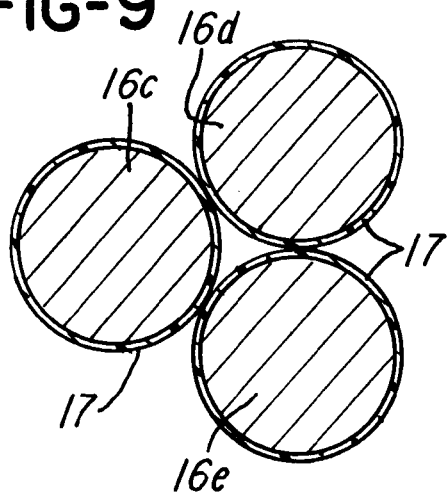
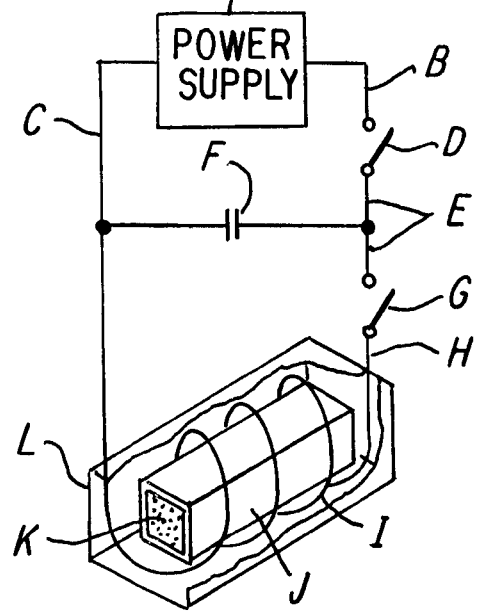

APPARATUS AND METHOD FOR MAKING AN ELECTRICAL COMPONENT

CROSS-REFERENCE TO RELATED APPLICATIONS

This application is based on provisional patent application Ser. No. 60/120,244 filed Feb. 16, 1999 and a continuation-in-part of Ser. No. 08/681,898 filed Jul. 29, 1996 now U.S. Pat. No. 6,273,963 which is a continuation-in-part application of Ser. No. 08/368,301 filed Jan. 3, 1995, now U.S. Pat. No. 5,611,230, which is a division of Ser. No. 07/834,148 filed Feb. 10, 1992, now U.S. Pat. No. 5,405,574.

BACKGROUND OF THE INVENTION

1. Field of the Invention

This invention relates to electrical components, such as transformers, chokes and, more particularly, to a method and system for forming particulate or powder-like materials into a unitary, firmly-compacted body of material to provide transformers, chokes, commutators, rotors and/or stators for motors.

2. Description of Related Art

Powder metal bodies have been formed by means of pressure and heat. Such a method has also been used for forming unitary bodies from other particulate materials. U.S. Pat. Nos. 5,405,574; 5,611,139; 5,611,230 and 5,689,797 all disclose systems and methods for compacting powder-like materials. For example, U.S. Pat. No. 5,689,797 discloses a method for producing an annular body wherein a container is filled with a particulate material and an electrically conductive drive member is used to induce a current in the container to cause a compaction pressure to be applied to the particulate material. This causes the material to compress and compact within the container into an annular body of magnetic compacted particulate material.

Similarly, U.S. Pat. No. 5,611,139 discloses a structure for increasing the density of a powder comprising a support for receiving the powder and an electrically conductive driver positioned adjacent the support and a connector for connecting the driver to a source of electrical energy for energizing the driver to create a magnetic field to pressure the powder, thereby producing an integral part from the powder. These patents are owned by the same Assignee as the present invention, and are incorporated herein by reference and made a part hereof.

FIG. 11 shows a prior art magnetic compaction system having a direct current power supply A to which is connected electrical conductors B and C. Connected to the conductor B is a switch D which is also connected to a conductor E. The conductor E and the conductor C have joined there between a capacitor. The conductor E is also connected to a switch G which is also connected a connector H. The conductor C and the conductor H are connected to a solenoid I which encompasses an electrically conductive container I. In operation, the switch is closed, and the capacitor F is charged from the power supply A. After the capacitor F is completely charged, the switch D is opened and the switch G is closed. When the switch G is closed, a large quantity of electrical current flows from the capacitor F through the solenoid or energizing coil I. When the electrical current flows through the solenoid or energizing coil I, magnetic pressure is applied upon the electrical conductive container J. This pressure acts inwardly upon the electrically conductive container J, and the transverse dimensions of the electrically conductive J are reduced. Thus, compaction occurs within the electrically conductive container 38 and the powder-like material K is compressed and compacted to form a dense body. Thus, the powderous material K within the electrically conductive container J becomes a dense body.

Due to the fact that the solenoid or energizing coil I tends to expand radially as current flows there through, suitable means have been employed to restrain the coil I against lateral expansion as current flows there through. For example, as shown in FIG. 11, a wall L may closely encompass the energizing solenoid or coil I and restrain the solenoid or coil I against expansion as current flows there through.

One problem with the current designs and configurations of ferrite-based transformers is that they tend to be relatively large. Consequently, the costs associated with manufacturing and producing such transformers tends to be relatively high, and reliability is not as good as desired.

What is needed, therefore, is a transformer design and manufacturing process capable of utilizing dynamic magnetic compaction technology which facilitates reducing the size of the parts, such as the transformers, and which reduces or eliminates the number of manufacturing and assembly steps required by prior art techniques.

SUMMARY OF THE INVENTION

This invention provides a system and method wherein powder-like and/or particulate materials are received in a container along with a insulated coil and subject to dynamic magnetic compaction to produce a transformer, choke, rotor or stator for an electric motor and the like.

The method and related structure of this invention applies pressures generated by non-contact electromagnetic forces. These electromagnetic pressures are generated by employing suitably shaped energizing coils, such as solenoids or the like, which have the necessary capacity. An electrically conductive container is provided wherein a powder-like material and an inner coil is situated therein. An electrical current is passed through a solenoid or energizing coil surrounding the container, and the electrically conductive container is reduced in transversed dimensions, thereby encasing both the particulate material and inner coil to provide a high density body which may be used as a transformer or choke. The compaction of the particulate material is preferably performed by electromagnetic compaction as electrical energy is applied in short time pulses.

An object of this invention is to provide a compacted electrical component having improved manufacturing characteristics, reduced cost and improved reliability.

Another object of this invention is to provide an electrical component manufactured using dynamic magnetic compaction.

In one aspect, this invention comprises a component part comprising a conductive container for receiving a powderous material, an internal coil having an insulating coating situated in the conductive container, the conductive container compacting the powderous material about the internal coil to form the component part when the conductive container is subject to an electromagnetic field.

In another aspect, this invention comprises a method of making a component part comprising the steps of providing a conductive container for receiving a powderous material, situating an internal coil having an insulating coating situated in the conductive container, situating a powderous material in the conductive container, energizing the conductive container to magnetically compact the conductive container and the powderous material to provide the component part.

In still another aspect, this invention comprises a compaction system comprising a power supply, a plurality of conductors coupled to the power supply, an energizing coil for providing an electromagnetic field, at least one capacitor connected across the energizing coil, at least one switch coupled to the plurality of conductors and selectively coupling the power supply to at least one capacitor and at least one switch, the energizing coil be situated relative to a conductive container in order to generate an electromagnetic field to energize a conductive container to magnetically compact a powderous material about an internal coil to form a component part, wherein the internal coil comprises an insulating coating.

Other objects and advantages of the invention will be apparent from the following description and the accompanying drawings.

BRIEF DESCRIPTION OF THE DRAWINGS

FIG. 1 is a perspective view of a part prior to compaction in accordance with one embodiment of the invention;

FIG. 2 is a sectional view of the part shown in FIG. 1;

FIG. 3 is a perspective view of the part shown in FIG. 1 after compaction;

FIG. 4 is a sectional view of the part shown in FIG. 3;

FIG. 5 is a perspective view of another part of another embodiment of the invention;

FIG. 6 is a perspective view of another part of another embodiment of the invention;

FIG. 7 is a schematic view of a magnetic compaction system in accordance with one embodiment of the invention;

FIG. 8 is a section view of a bobbin in accordance with one embodiment of the invention;

FIG. 9 is a sectional view, taken along the line 9—9 in FIG. 2, of a plurality of wires having an insulative coating which comprise the coil;

FIG. 11 is an illustration of a prior art device.

DETAILED DESCRIPTION OF THE PREFERRED EMBODIMENT

Figure 10A:
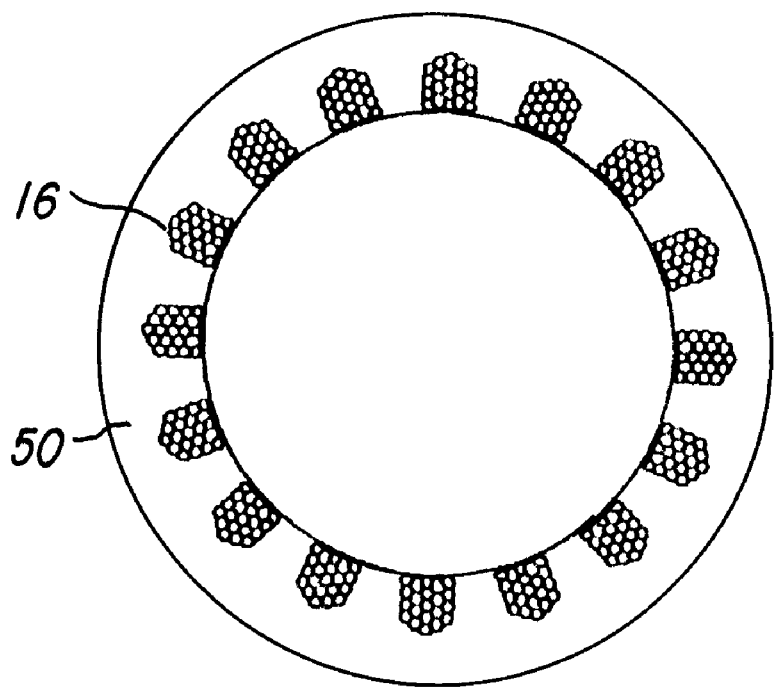
FIGS. 10A and 10B are views of wound stators for an electrical motor manufactured in accordance with this invention.

FIGS. 1–10 illustrate various embodiments of the invention. As illustrated in FIG. 1, a component, such as a transformer 10, is shown having an electrically conductive container 12 for receiving a powderous material 14 and an internal coil 16. The internal coil 16 has an insulated coating of varnish or other suitable coating.

Although the coil 16 is described as having the insulation mentioned, it should be appreciated that other types of insulation may be utilized. For example, a suitable pliable varnish or other insulation product, such as FORMVAR, may be utilized as well. Another example of an alternate coating could be polyimide. The important point is that the coil 16 and each of the wires 16c–16e (FIG. 9) have an insulation 17 to insulate them from the material 14 both during and after compaction.

In the embodiment being described, the powder 14 is preferably either a ferrite or iron powder or any other suitable magnetic powder material. The powder 14 is situated in the container 12 and around the coil 16. The container 12, powder 14 and coil 16 are then placed inside another solenoid or energizing coil 18 as shown in FIG. 7.

As best illustrated in FIG. 7, the invention comprises a power supply 20 coupled to the conductors 22 and 24. Connected to the conductor 22 is a switch 26 which is also connected to a conductor 28. The conductor 28 and the conductor 24 have joined there between a capacitor 30. The conductor 28 is also connected to a switch 32 which is also connected to a conductor 34. The conductor 24 and the conductor 34 are connected to the solenoid or energizing coil 18 which encompasses the electrically conductive container 12. The electrically conductive container 12 is shown as being cylindrical in transverse dimension; however, the electrically conductive container 12 may be of any suitable or desired shape and size. The electrically conductive container may be of any suitable, electrically conductive material, such as, for example, silver, aluminum, copper or other conductive material.

During operation, the switch 26 is closed, and the capacitor 30 is charged from the power supply 20. After the capacitor 30 is completely charged, the switch 26 is opened and the switch 32 is closed. When the switch 32 is closed, a large quantity of electrical current flows from the capacitor 30 through the solenoid or coil 36. When the electrical current flows through the coil or solenoid 36, magnetic pressure is applied upon the electrically conductive container 38. The pressure acts similarly upon the electrically conductive container 38, and the transverse dimension of the electrically conductive container 38 are reduced. Thus, compression occurs within the electrically conductive container, and the powder-like material 14 is compacted and compressed around coil 16. The powderous material 14 becomes a dense body and the container 12, powder 14 and inner coil 16 provide a unitary finished part useful in providing a transformer or choke. In order to facilitate the compacting process, the container 12, powder 14 and soil 16 may be placed in a retaining die (not shown) having a top and bottom in support of end 12a and 12b of container 12.

As best illustrated in FIGS. 1–5, the coil 16 has a plurality of leads 16a and 16b which extend outside of end 12a and end 12b, respectively, of container 12.

It should be appreciated that the position of the leads may vary depending on the application. For example, FIG. 5 shows leads 1a and 16b both extending from end 12a of container 12. In addition, it is envisioned that the invention may comprise more than one inner coil 16, such as the use of multiple coils 40 and 42 which are stacked as shown in FIG. 6 or they could be interlaced or woven so that the turns of each coil are adjacent to each other.

It should appreciated that the performance of the finished part will depend on the magnetic properties of the consolidated powder 14 and the compaction between the turns of the coil 16.

The magnetic performance of the powder 14 can be enhanced by using powders which have high inherent bonding characteristics and permeability, such as pure iron powder. Iron powders are preferable because of their inherent binding ability during magnetic compaction. It has been found that the performance of the component 10 can be enhanced by utilizing plastic coated powders, such as EM-1 products available from Quebec Metal Products, Inc. Performance is also enhanced by improving the compacted density of the powder 14. In this regard, features of the invention described in U.S. patent application Ser. No. 08/681,898, now U.S. Pat. No. 6,273,963 which is assigned to the same Assignee as the present invention and which is incorporated herein by reference and made apart hereof may be utilized.

Also, it has been found that providing wire 16 in an octagonal or hexagonal or other cross-sectional shaped facilitates improving the compacted density of part 10 which, in turn, improves performance.

Moreover, it has been found that powder 14 between the turns of coil 16 may tend to "short circuit" the magnetic periphery of the component 10. One way to reduce or eliminate this effect is by utilizing a non-magnetic or insulating bobbin 44 (FIG. 8) formed, for example, of plastic. It has also been found that using a non-magnetic filler material 46 between the wires 16c–16e further facilitate preventing any short circuit between or among any of the wires 16c–16e.

Another advantage of this compacted powder component design is that it facilitates dissipating heat because the compacted powder 14 conducts the heat away from coil 16.

In the embodiment being described, the container 12 (FIGS. 1–5) comprises an exemplary dimension of 16mm diameter, but it should be appreciated that smaller or larger components 10 may be made without departing from the features of the invention. Further, the wires 16c–16e which make up coil 16 each have a diameter of about 1mm and are made of copper, and these dimensions may be varied as desired. After applying the techniques of the invention to compact the container 12 and powder 14 about coil 16, the dimensions of the finished compacted part 10 are on the order of about 42mm. It should be appreciated, however, that the dimensions and characteristics of the part 10 may be selectively varied depending upon the application.

Figure 10B:
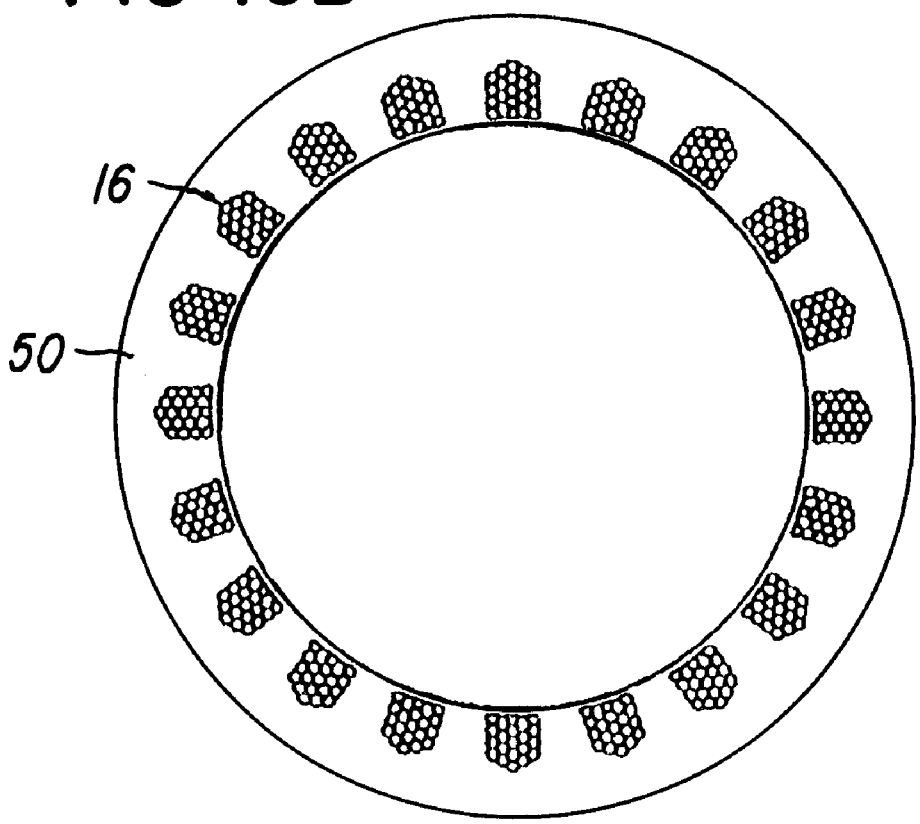

It should be appreciated that this invention may be utilized to make transformers, chokes, commutators, rotors and stators for electrical motors and any other components which can benefit from the application of dynamic magnetic compaction technology described herein. For example, FIG. 10 shows a cross-sectional view of a wound stator 50 having the wires 16 compacted therein to provide a finished stator which, when used with a rotor (not shown) and power supply (not shown) provide an electric motor capable of performing work.

While the methods herein described, and the forms of apparatus for carrying these methods into effect, constitute preferred embodiments of this invention, it is to be understood that the invention is not limited to these precise methods and forms of apparatus, and that changes may be made in either without departing from the scope of the invention disclosed herein.

What is claimed is:

1. A component part comprising:
  a powderous material;
  a continuous body having an insulating coating situated in a conductive container;
  said powderous material being compacted about said continuous body to form said component part in response to said conductive container being subject to an electromagnetic field.

2. The component part as recited in claim 1 wherein said component part is a transformer, motor, commutator, rotor or choke.

3. The component part as recited in claim 1 wherein said continuous body is an internal coil comprising a plurality of coils.

4. The component part as recited in claim 3 wherein each of said plurality of coils define a non-circular shape in cross-section.

5. The component part as recited in claim 4 wherein said non-circular shape is hexagonal or octagonal.

6. The component part as recited in claim 1 wherein said continuous body comprises an internal coil comprising a plurality of leads extending outside said container.

7. The component part as recited in claim 6 wherein said conductive container comprises a first end and a second end, said plurality of leads extending out of only one of said first end or second end.

8. The component part as recited in claim 6 wherein said conductive container comprises a first end and a second end, said plurality of leads extending out of at least said first and second ends.

9. The component part as recited in claim 1 wherein said insulative coating comprises one of following: varnish, FORMVAR or polyimide.

10. The component part as recited in claim 3 wherein said plurality of coils comprises adjacent coils, said component part comprising a non-magnetic filler situated between said adjacent coils.

11. The component part as recited in claim 1 wherein said powderous material comprises a ferrite or iron powder.

12. The component part as recited in claim 1 wherein said electrically conductive container comprises aluminum, silver, copper or steel.

13. The component part as recited in claim 1 wherein said continuous body comprises a conductive coil wrapped around a non-conductive bobbin and said bobbin and conductive coil are situated in said electrically conductive container.

14. The component part as recited in claim 1 wherein said continuous body comprises an internal coil of copper.

15. The component part as recited in claim 1 wherein said continuous body comprises an internal coil comprising a diameter of less than 1 mm.

16. A method of making a component part comprising the steps of:
  providing a conductive container for receiving a powderous material;
  situating a continuous body having an insulating coating situated in the conductive container;
  situating a powderous material in said conductive container;
  energizing said conductive container to magnetically compact said conductive container and said powderous material to provide said component part.

17. The method as recited in claim 16 wherein said component part is a transformer, motor, commutator, rotor or choke.

18. The method as recited in claim 16 wherein said method further comprises the step of:
  providing a continuous body in the form of an internal coil comprising a plurality of coils.

19. The method as recited in claim 16 wherein said method further comprises the step of:
  providing a continuous body in the form of a plurality of coils each defining a non-circular shape in cross-section.

20. The method as recited in claim 19 wherein said non-circular shape is hexagonal or octagonal.

21. The method as recited in claim 16 wherein said continuous body comprises an internal coil comprises a plurality of leads, said situating step further comprises the step of:
  situating said internal coil into said conductive container such that said plurality of leads extend outside said container.

22. The method as recited in claim 16 wherein said container comprises a first end and a second end, said situating step further comprising the step of situating said continuous body into said conductive container such that said plurality of leads extend out of only one of said first end or second end.

23. The method as recited in claim 16 wherein said container comprises a first end and a second end, said situating step further comprising the step of situating said continuous body into said conductive container such that said plurality of leads extend out of at least said first and second ends.

24. The method as recited in claim 16 wherein said method comprises the step of:

providing said continuous body comprising an internal coil comprising an insulative coating comprising one of following: varnish, FORMVAR or polyimide.

25. The method as recited in claim 18 wherein said method further comprises the step of:

providing a plurality of coils comprising adjacent coils;

situating a non-magnetic filler between said adjacent coils.

26. The method as recited in claim 16 wherein said situating step comprises the step of;

situating a ferrite or iron powder into said conductive container before said energizing step.

27. The method as recited in claim 16 wherein said providing step further comprises the step of:

providing an electrically conductive container of aluminum, silver, copper or steel.

28. The method as recited in claim 16 wherein said method further comprises the step of:

wrapping said internal coil around a non-conductive bobbin and said bobbin and conductive coil are situated in said electrically conductive container.

29. The method as recited in claim 16 wherein said providing step comprises the step of:

providing an conductive container of copper.

30. The method as recited in claim 16 wherein said continuous body comprises a diameter of less than 1 mm.

31. A compaction system comprising:

a power supply;

a plurality of conductors coupled to said power supply;

an energizing coil for providing an electromagnetic field;

at least one capacitor connected across said energizing coil;

at least one switch coupled to said plurality of conductors and selectively coupling said power supply to said at least one capacitor and said at least one switch;

said energizing coil be situated relative to a conductive container in order to generate an electromagnetic field to energize a conductive container to magnetically compact a powderous material about an internal coil to form a component part, wherein said internal coil comprises an insulating coating.

32. The compaction system as recited in claim 31 wherein said component part is a transformer, motor, commutator, rotor or choke.

33. The compaction system as recited in claim 31 wherein said internal coil comprises a plurality of coils.

34. The compaction system as recited in claim 3 wherein each of said plurality of coils define a non-circular shape in cross-section.

35. The compaction system as recited in claim 31 wherein said non-circular shape is hexagonal or octagonal.

36. The compaction system as recited in claim 31 wherein said internal coil comprises a plurality of leads extending outside said container.

37. The compaction system as recited in claim 36 wherein said container comprises a first end and a second end, said plurality of leads extending out of only one of said first end or second end.

38. The compaction system as recited in claim 36 wherein said container comprises a first end and a second end, said plurality of leads extending out of at least said first and second ends.

39. The compaction system as recited in claim 32 wherein said insulative coating comprises one of following: varnish, FORMVAR or polyimide.

40. The compaction system as recited in claim 33 wherein said plurality of coils comprises a djacent coils, said component part comprising a non-magnetic filler situated between said adjacent coils.

41. The compaction system as recited in claim 31 wherein said powderous material comprises a ferrite or iron powder.

42. The compaction system as recited in claim 31 wherein said electrically conductive container comprises aluminum, silver, copper or steel.

43. The compaction system as recited in claim 31 wherein said conductive coil is wrapped around a non-conductive bobbin and said bobbin and conductive coil are situated in said electrically conductive container.

44. The compaction system as recited in claim 31 wherein said internal coil is copper.

45. The compaction system as recited in claim 31 wherein said internal coil comprises a diameter of less than 1 mm.

* * * * *